(12) United States Patent
Aiso et al.

(10) Patent No.: US 10,403,531 B2
(45) Date of Patent: Sep. 3, 2019

(54) SEMICONDUCTOR MANUFACTURING APPARATUS WITH SUPPORTING COLUMNS AND TABLES

(71) Applicant: TOSHIBA MEMORY CORPORATION, Minato-ku (JP)

(72) Inventors: Fumiki Aiso, Kuwana (JP); Ryota Fujitsuka, Yokkaichi (JP); Kensei Takahashi, Kuwana (JP); Takayuki Matsui, Kuwana (JP); Tomohisa Iino, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/915,792

(22) Filed: Mar. 8, 2018

(65) Prior Publication Data
US 2019/0067066 A1 Feb. 28, 2019

(30) Foreign Application Priority Data
Aug. 31, 2017 (JP) .................. 2017-167818

(51) Int. Cl.
| | | |
|---|---|---|
| H01L 21/67 | (2006.01) | |
| H01L 21/673 | (2006.01) | |
| H01L 21/687 | (2006.01) | |
| H01L 21/677 | (2006.01) | |
| B25J 11/00 | (2006.01) | |

(Continued)

(52) U.S. Cl.
CPC ..... *H01L 21/67745* (2013.01); *B25J 11/0095* (2013.01); *B25J 15/0014* (2013.01); *H01L 21/67017* (2013.01); *H01L 21/67303* (2013.01); *H01L 21/67309* (2013.01);
(Continued)

(58) Field of Classification Search
CPC ......... H01L 21/67017; H01L 21/67313; H01L 21/68707; H01L 21/67745
See application file for complete search history.

(56) References Cited

U.S. PATENT DOCUMENTS

| | | | | |
|---|---|---|---|---|
| 2012/0240857 A1* | 9/2012 | Morozumi | ........ | H01L 21/67109 118/725 |
| 2016/0322248 A1* | 11/2016 | Fukushima | ............. | H01L 21/68 |
| 2017/0114464 A1* | 4/2017 | Iriuda | ................. | C23C 16/4584 |

FOREIGN PATENT DOCUMENTS

| | | |
|---|---|---|
| JP | 2010-177245 | 8/2010 |
| JP | 5565242 | 8/2014 |
| JP | 2017-79289 | 4/2017 |

* cited by examiner

*Primary Examiner* — Gerald McClain
(74) *Attorney, Agent, or Firm* — Oblon, McClelland, Maier & Neustadt, L.L.P.

(57) ABSTRACT

In one embodiment, a semiconductor manufacturing apparatus includes a container to contain wafers, and supporting tables provided in the container so as to be stacked on one another, and each including a supporting face that comes into contact with a wafer to support the wafer. The apparatus further includes supporting columns to join the supporting tables together and provided at positions where the supporting columns are contained inside outer circumferences of the supporting tables. The apparatus further includes a gas feeder to feed a gas to the wafers on the supporting tables, and a gas discharger to discharge the gas fed to the wafers on the supporting tables. Each of the supporting tables includes a first upper face as the supporting face, and a second upper face provided so as to surround the first upper face at a level higher than a level of the first upper face.

7 Claims, 9 Drawing Sheets

(51) Int. Cl.
  *B25J 15/00* (2006.01)
  *C23C 16/44* (2006.01)
(52) U.S. Cl.
  CPC .. *H01L 21/67313* (2013.01); *H01L 21/67748* (2013.01); *H01L 21/68707* (2013.01); *C23C 16/44* (2013.01)

SEMICONDUCTOR MANUFACTURING APPARATUS WITH SUPPORTING COLUMNS AND TABLES

CROSS REFERENCE TO RELATED APPLICATION

This application is based upon and claims the benefit of priority from the prior Japanese Patent Application No. 2017-167818, filed on Aug. 31, 2017, the entire contents of which are incorporated herein by reference.

FIELD

Embodiments disclosed herein relate to a semiconductor manufacturing apparatus, a wafer conveying apparatus and a wafer conveying method.

BACKGROUND

In a batch processing apparatus that simultaneously processes a plurality of wafers with a gas, the gas is required to flow appropriately. Specifically, when the gas flows from a gas feeder to a gas discharger, it is not desirable for the gas to flow around the wafers, and it is desirable for the gas to mostly flow between the wafers. Moreover, when the gas to be fed to a certain wafer flows to another wafer, there is a risk that unevenness in processing between the wafers arises.

DETAILED DESCRIPTION

Embodiments will now be explained with reference to the accompanying drawings.

In one embodiment, a semiconductor manufacturing apparatus includes a container configured to contain a plurality of wafers, and a plurality of supporting tables provided in the container so as to be stacked on one another, and each including a supporting face that comes into contact with a wafer to support the wafer. The apparatus further includes a plurality of supporting columns configured to join the supporting tables together and provided at positions where the supporting columns are contained inside outer circumferences of the supporting tables. The apparatus further includes a gas feeder configured to feed a gas to the wafers on the supporting tables, and a gas discharger configured to discharge the gas fed to the wafers on the supporting tables. Moreover, each of the supporting tables includes a first upper face as the supporting face, and a second upper face provided so as to surround the first upper face at a level higher than a level of the first upper face.

First Embodiment

Figure 1:
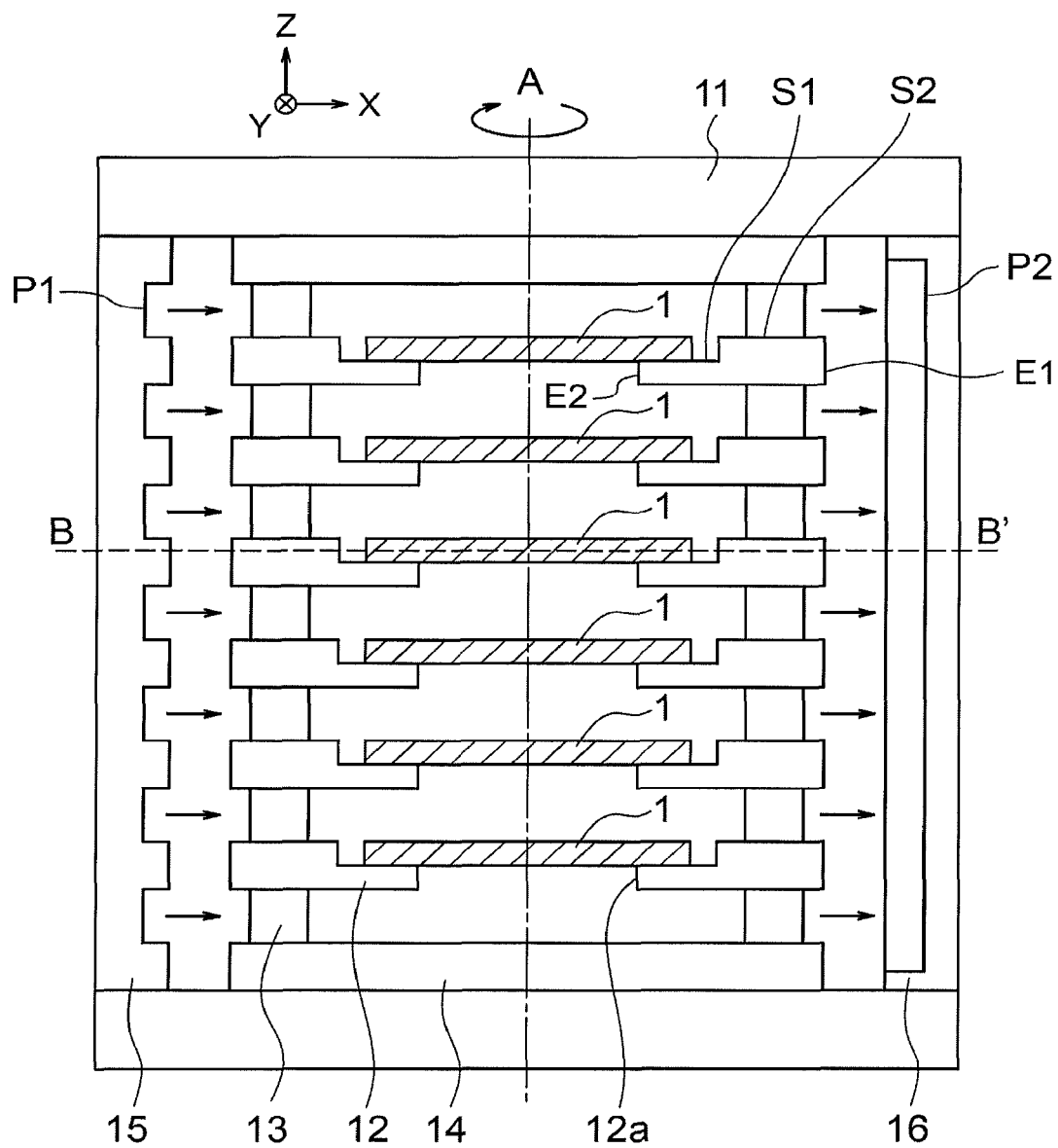
FIG. 1 is a cross-sectional view schematically showing a structure of a semiconductor manufacturing apparatus of a first embodiment.

FIG. 1 is a cross-sectional view schematically showing a structure of a semiconductor manufacturing apparatus of a first embodiment.

The semiconductor manufacturing apparatus in FIG. 1 includes a reactor 11 which is an example of a container, a plurality of boats 12 which are an example of a plurality of supporting tables, a plurality of supporting columns 13, a pedestal 14, a gas feeder 15 and a gas discharger 16. The semiconductor manufacturing apparatus in FIG. 1 is a cross-flow batch processing apparatus which simultaneously processes a plurality of wafers 1 with a gas, for example, a chemical vapor deposition (CVD) apparatus or an atomic layer deposition (ALD) apparatus.

The reactor 11 includes an inner tube 11a which contains the plurality of wafers 1, and an outer tube 11b which contains the inner tube 11a. The inner tube 11a and the outer tube 11b are an example of glass tubes. FIG. 1 shows an X-direction and a Y-direction which are parallel to surfaces of these wafers 1 and perpendicular to each other, and a Z-direction perpendicular to the surfaces of these wafers 1. In the present specification, the +Z-direction is handled as the upward direction and the −Z-direction is handled as the downward direction. Nevertheless, the −Z-direction may coincide with the direction of gravity or may not coincide therewith.

Each boat 12 has a supporting face that comes into contact with the wafer 1 to support the wafer 1, and the wafer 1 is placed on the supporting face. Each boat 12 has an annular shape having an outer circumference E1 and an inner circumference E2, and has an opening 12a enclosed by the inner circumference E2. Moreover, each boat 12 has a first upper face S1 which is the supporting face, and a second upper face S2 provided so as to surround the first upper face S1 at a higher level than that of the first upper face S1. A level difference exists between the first upper face S1 and the second upper face S2. In the present embodiment, the plurality of boats 12 are installed in the inner tube 11a so as to be stacked on one another. These boats 12 are formed, for example, of quartz.

Each supporting column 13 joins the boats 12 together, and is provided at a position where it is contained inside the outer circumferences E1 of these boats 12. Specifically, each supporting column 13 is provided at a position where it is contained between the outer circumferences E1 and the inner circumferences E2 of these boats 12. Therefore, as these boats 12 are observed from the above, all the supporting columns 13 are hidden under the boats 12, and do not protrude from the outer circumferences E1 or the inner circumferences E2 of the boats 12. These supporting columns 13 are formed, for example, of quartz.

Each supporting column 13 joins adjacent boats 12 together and does not penetrate these boats 12. Specifically, each supporting column 13 is welded onto a lower face of one boat 12 and an upper face of the other boat 12. Nevertheless, each supporting column 13 may join a plurality of boats 12 together by penetrating one or more boats 12. As mentioned later, adjacent boats 12 of the present embodiment are joined together by three supporting columns 13.

The pedestal 14 supports a boat structure composed of these boats 12 and supporting columns 13, and rotates the boat structure around a rotational axis A shown in FIG. 1.

The gas feeder 15 is disposed between the inner tube 11a and the outer tube 11b and includes gas feeding ports P1 that feed gas to the wafers 1 on the boats 12. The gas feeding ports P1 are provided for the individual boats 12 in order to feed gas onto surfaces of the wafers 1.

The gas discharger 16 is disposed between the inner tube 11a and the outer tube 11b and includes a gas discharge port P2 that discharges the gas fed to the wafers 1 on the boats 12.

FIG. 1 schematically shows the shapes and the arrangements of these components as needed for easy understanding of the description of these components. For example, FIG. 1 shows components on the same cross section, which components do not appear on the same cross section in the strict sense. More correct shapes and arrangements of such components are mentioned later with reference to FIGS. 2A to 3.

Figure 2A:
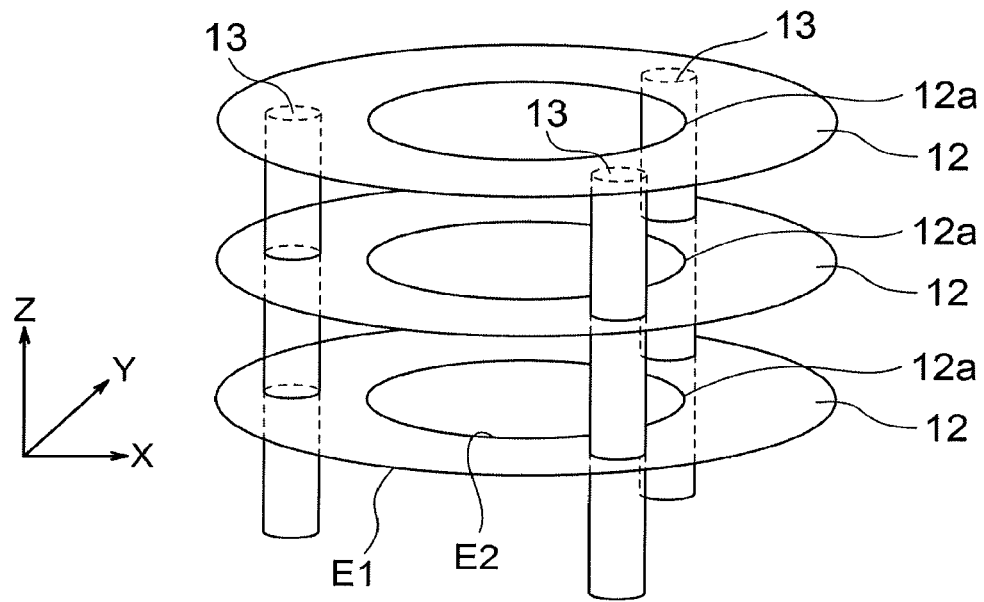
FIGS. 2A and 2B are perspective views showing a boat structure of the semiconductor manufacturing apparatus of the first embodiment.
Figure 2B:
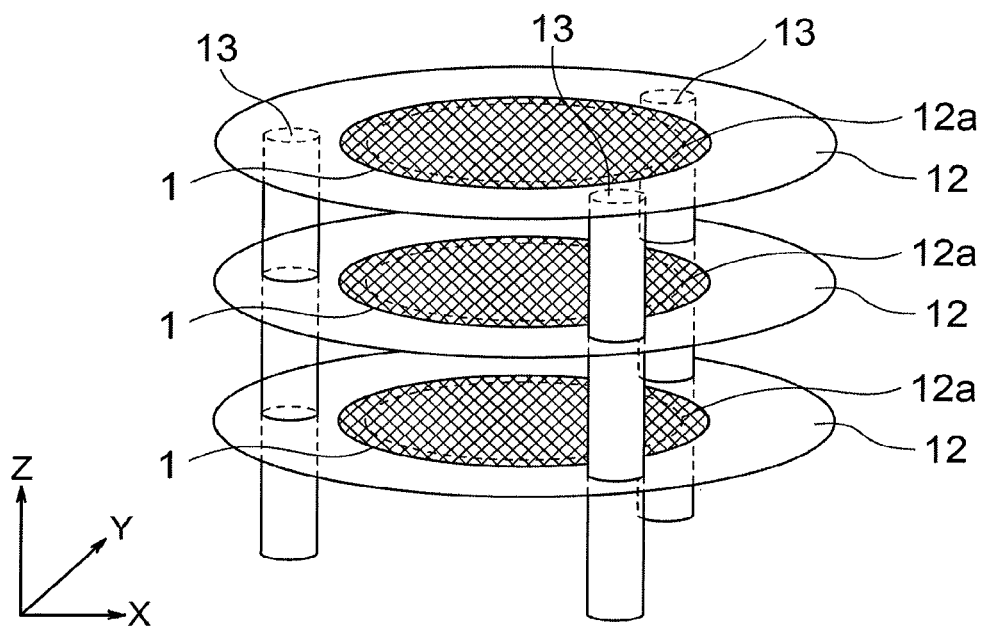

FIGS. 2A and 2B are perspective views showing the boat structure of the semiconductor manufacturing apparatus of the first embodiment.

FIG. 2A exemplarily shows three boats 12 and a plurality of supporting columns 13 which join these boats 12 together. Each supporting column 13 is provided at a position where it is contained between the outer circumferences E1 and the inner circumferences E2 of these boats 12.

FIG. 2B exemplarily shows a state where wafers 1 are placed on these boats 12. Since a diameter of the inner circumference E2 of the boat 12 is set to be smaller than a diameter of the wafer 1, the opening 12a of the boat 12 is covered by the wafer 1. As mentioned later, the opening 12a is used when the wafer 1 is elevated.

Figure 3:
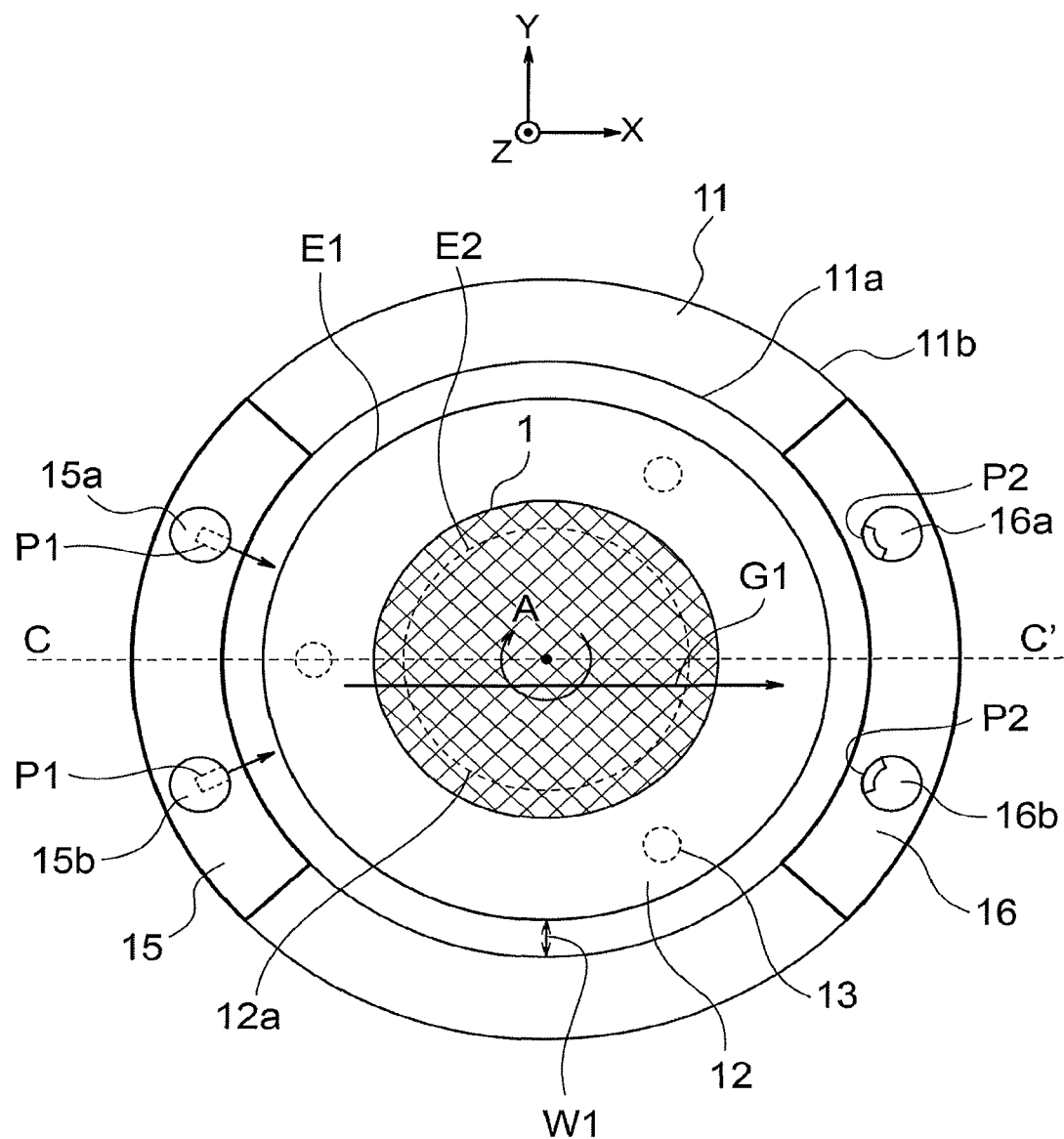
FIG. 3 is a cross-sectional view showing the structure of the semiconductor manufacturing apparatus of the first embodiment.

FIG. 3 is a cross-sectional view showing the structure of the semiconductor manufacturing apparatus of the first embodiment. FIG. 3 shows a cross section taken along the B-B' line shown in FIG. 1. Meanwhile, FIG. 1 shows a cross section taken along the C-C' line shown in FIG. 3.

The gas feeder 15 includes first and second injectors 15a and 15b that feed gas to the wafer 1 from the gas feeding ports P1. For example, the first injector 15a is used for feeding first source gas. The second injector 15b is used for feeding second source gas different from the first source gas. The gas feeding port P1 is an example of a nozzle that ejects gas.

The gas discharger 16 includes first and second gas discharging tubes 16a and 16b for discharging the gas fed to the wafer 1 from the gas discharging port P2. An arrow G1 schematically shows a flow of gas above the wafer 1.

Sign W1 denotes a distance (clearance) between the outer circumference E1 of the boat 12 and an inner wall of the reactor 11. The inner wall of the reactor 11 of the present embodiment is formed of an inner circumferential face of the inner tube 11a.

The supporting columns 13 of the present embodiment are provided at positions where they are contained inside the outer circumference E1 of the boat 12, and do not protrude outside the outer circumference E1. Therefore, the clearance W1 can be set to be short. Thereby, gas flowing around the wafer 1 can be reduced, and the gas can be mostly caused to flow between the wafers 1 as indicated by the arrow G1. Furthermore, gas to be fed to a certain wafer 1 can be suppressed from flowing in toward another wafer 1. As above, according to the present embodiment, gas can be appropriately fed to the wafers 1, and unevenness in processing between the wafers 1 can be reduced.

Gas from the gas feeder 15 is ideally desirable to flow entirely between the wafers 1. Hence, in the present embodiment, the clearance W1 is set to be short. For example, it is desirable for 90% or more of gas from the gas feeder 15 to flow between the wafers 1. According to an experiment, when the clearance W1 is 10 mm or less, 90% or more of gas flows between the wafers 1. Therefore, the clearance W1 of the present embodiment is set to be 10 mm or less.

Figure 4:
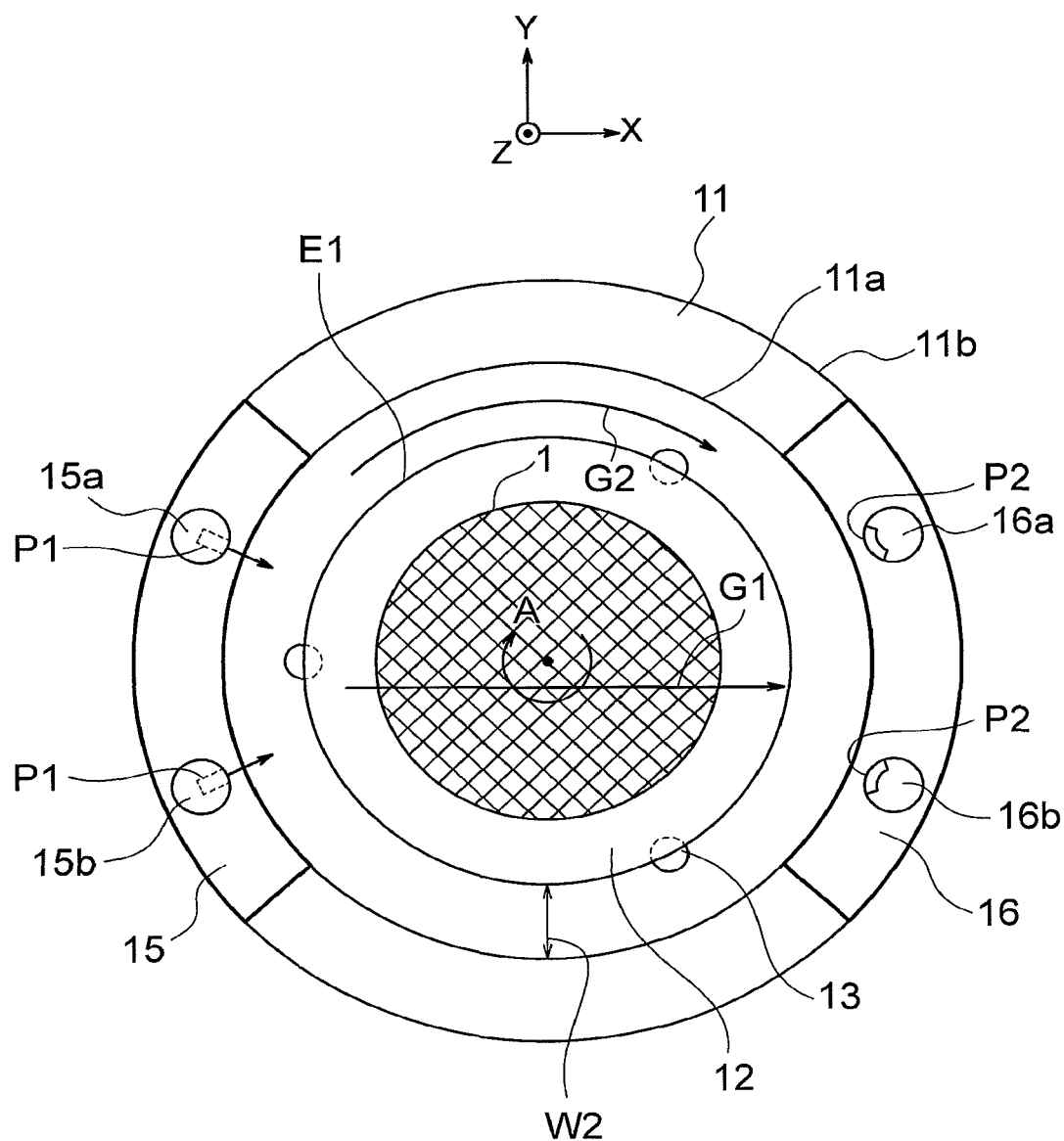
FIG. 4 is a cross-sectional view showing a structure of a semiconductor manufacturing apparatus according to a comparative example of the first embodiment.

FIG. 4 is a cross-sectional view showing a structure of a semiconductor manufacturing apparatus according to a comparative example of the first embodiment.

The supporting columns 13 of the comparative example are not provided at positions where they are contained inside the outer circumference E1 of the boat 12 but protrude outside the outer circumference E1. Therefore, a clearance W2 cannot be set to be short. As a result, not only much gas from the gas feeder 15 flows between the wafers 1 as indicated by the arrow G1, but also much gas results in flowing around the wafers 1 as indicated by an arrow G2. The gas on the arrow G2 flows in toward another wafer 1, which causes unevenness in processing between the wafers 1.

On the other hand, according to the present embodiment, a flow of gas as indicated by the arrow G2 can be reduced. The semiconductor manufacturing apparatus of the present embodiment is useful, for example, in the case where a wafer 1 large in surface area and a wafer 1 small in surface area are simultaneously processed. The former wafer 1 is an example of a wafer for manufacturing a memory with a three-dimensional structure. The latter wafer 1 is an example of a dummy wafer for monitoring a state inside the reactor 11. In such a case, a flow of gas as indicated by the arrow G2 tends to cause unevenness in processing between the wafers 1 in the vicinity of the dummy wafer. According to the present embodiment, a flow of gas as indicated by the arrow G2, however, can be reduced, which can reduce such unevenness.

Since in the present embodiment, the supporting columns 13 are positioned inside the outer circumference E1 of the boat 12, there is a risk that it is difficult for the wafer 1 to be placed on the boat 12. Therefore, the semiconductor manufacturing apparatus of the present embodiment includes a wafer conveying apparatus having a structure with which the wafer 1 can be easily placed on such a boat 12. Hereafter, details of the wafer conveying apparatus are described.

FIGS. 5A to 5D are perspective views and cross-sectional views showing a structure of the wafer conveying apparatus of the first embodiment.

Figure 5A:
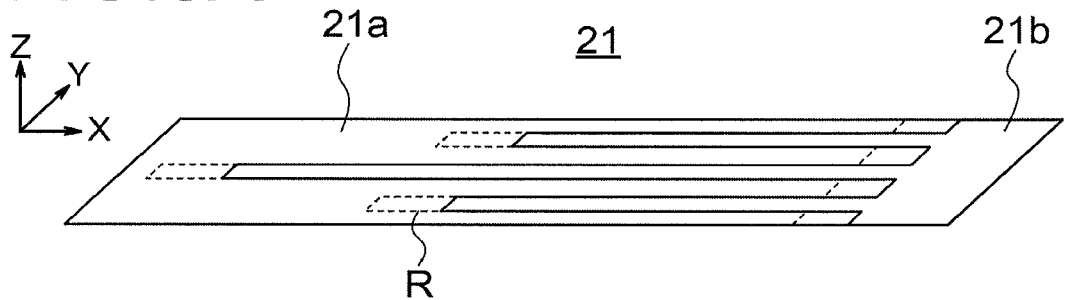
FIGS. 5A to 5D are perspective views and cross-sectional views showing a structure of a wafer conveying apparatus of the first embodiment.
Figure 5B:
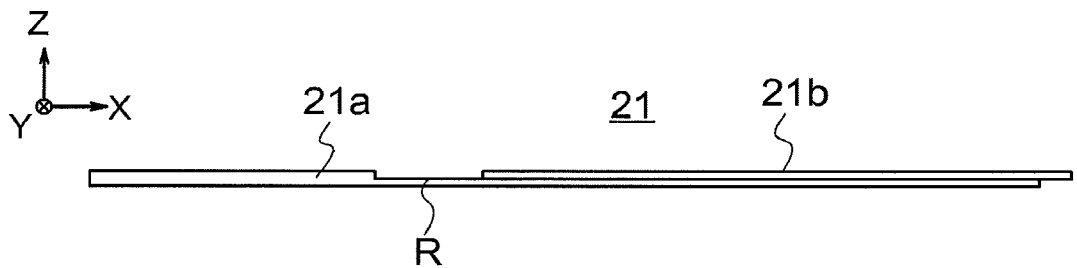

FIG. 5A and FIG. 5B are a perspective view and a cross-sectional view showing a lifting arm 21 constituting the wafer conveying apparatus, respectively. The lifting arm 21 can elevate and lower the wafer 1 in the reactor 11. The lifting arm 21 is an example of a second arm. A conveying arm 22 mentioned later is an example of a first arm.

Figure 5C:
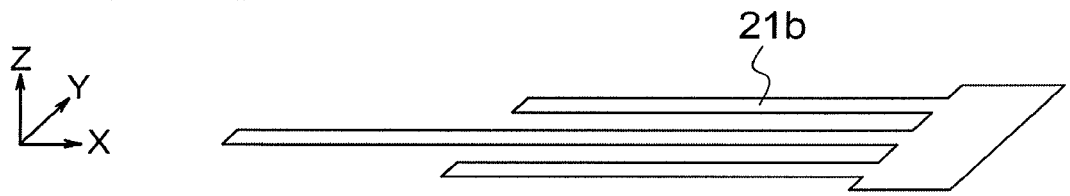
Figure 5D:
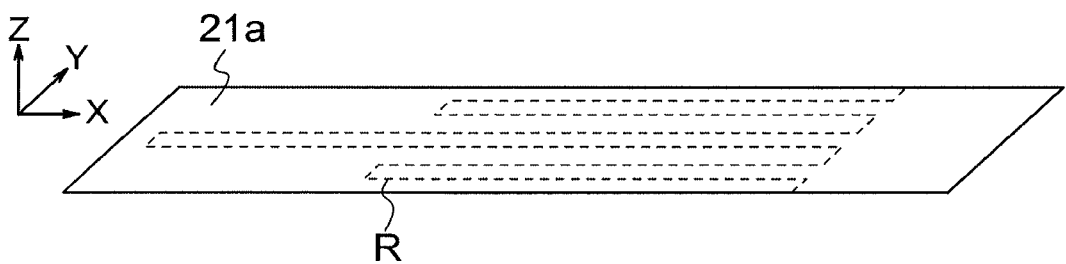

The lifting arm 21 is constituted of a lower plate 21a and an upper plate 21b. The upper plate 21b is placed on the lower plate 21a. FIG. 5C and FIG. 5D are perspective views showing shapes of the upper plate 21b and the lower plate 21a, respectively. The upper plate 21b can slide along a groove R provided in the lower plate 21a. The upper plate 21b has a plurality of (herein, three) linear parts. While the groove R has substantially the same shape as that of the upper plate 21b, it has a slightly larger size than the upper plate 21b such that the upper plate 21b can slide therein. The lower plate 21a is an example of a first plate. The upper plate 21b is an example of a second plate.

Figure 6A:
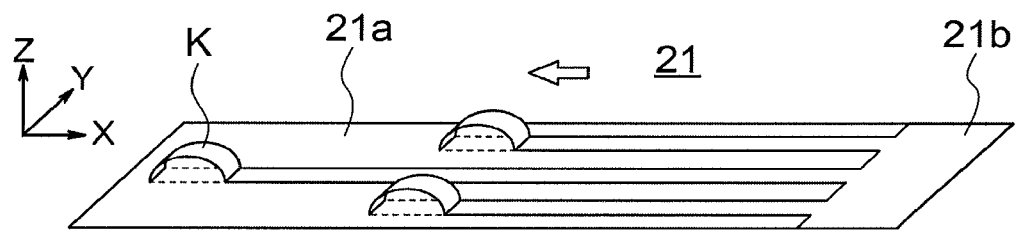
FIGS. 6A to 6C are a perspective view and cross-sectional views for explaining operation of the wafer conveying apparatus of the first embodiment.
Figure 6B:
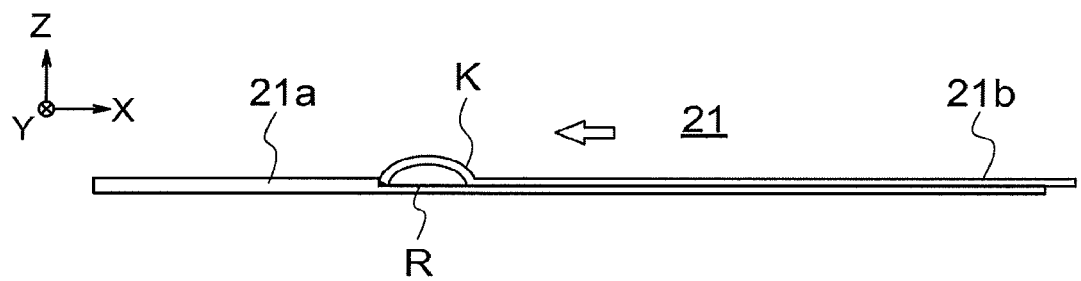
Figure 6C:
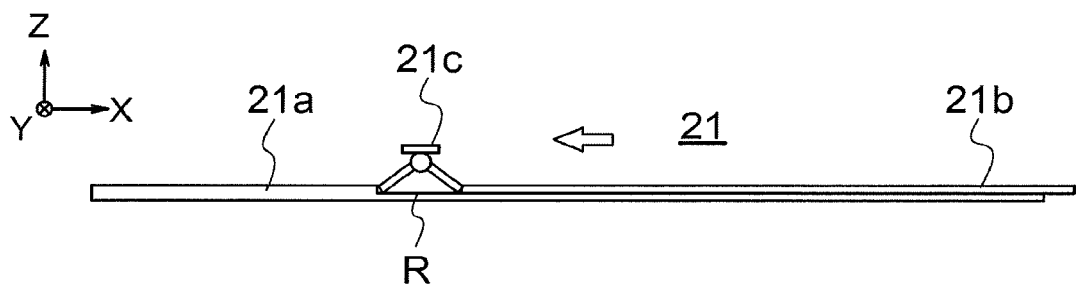

FIGS. 6A to 6C are a perspective view and cross-sectional views for explaining operation of the wafer conveying apparatus of the first embodiment.

When the upper plate 21b shown in FIG. 5A and FIG. 5B slides relative to the lower plate 21a in the −X-direction, the shape of the upper plate 21b changes as in FIG. 6A and FIG. 6B. Specifically, when the upper plate 21b slides in the −X-direction, the tips of the upper plate 21b abut against the tips of the groove R, and the tips of the upper plate 21b are deformed so as to be bent as indicated by sign K. In this stage, when the wafer 1 exists above the tips of the upper plate 21b, the tips of the upper plate 21b come into contact with the wafer 1 to elevate the wafer 1. This is referred to as lift-up of the wafer 1. Meanwhile, when the upper plate 21b slides in the +X-direction, the bending of the tips of the upper plate 21b is relieved, so that the wafer 1 is lowered.

In the present embodiment, as shown in FIG. 6C, a hinge 21c may be disposed between the tip of the upper plate 21b and the tip of the groove R. In this case, when the upper plate 21b slides in the −X-direction, the hinge 21c is pushed between the tip of the upper plate 21b and the tip of the groove R, and the hinge 21c is deformed to close. In this stage, when the wafer 1 exists above the hinge 21c, the hinge 21c comes into contact with the wafer 1 to elevate the wafer 1. Meanwhile, when the upper plate 21b slides in the +X-direction, the hinge 21c closes, so that the wafer 1 is lowered. The hinge 21c is an example of a member positioned between the first plate and the second plate.

FIGS. 7A to 8C are perspective views showing an operation example of the wafer conveying apparatus of the first embodiment. FIGS. 7A to 8C show processes through which one wafer 1 is conveyed on an arbitrary boat 12 in the reactor 11. This boat 12 is an example of a first supporting table. This wafer 1 is an example of a first wafer.

Figure 7A:
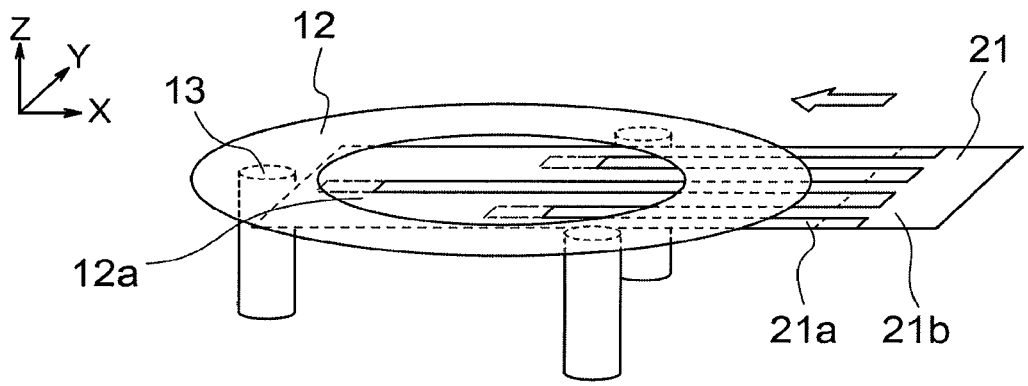
FIGS. 7A to 8C are perspective views showing an operation example of the wafer conveying apparatus of the first embodiment.

First, the lifting arm 21 moves to a lower region of the boat 12 (FIG. 7A). Specifically, the lifting arm 21 moves such that the tips of the upper plate 21b and the tips of the groove R are positioned below the opening 12a.

Figure 7B:
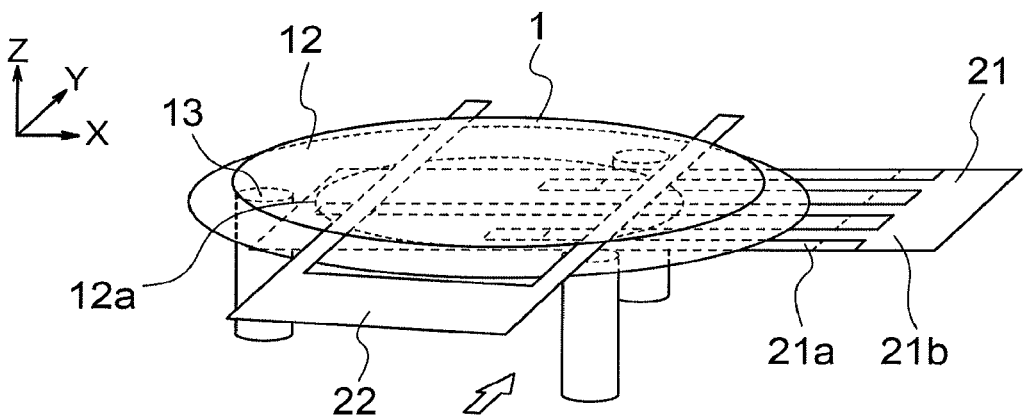

Next, the conveying arm 22 retains the wafer 1 to move to an upper region of this boat 12 (FIG. 7B). The conveying arm 22 has a plurality of (herein, two) linear parts for retaining the wafer 1.

Figure 7C:
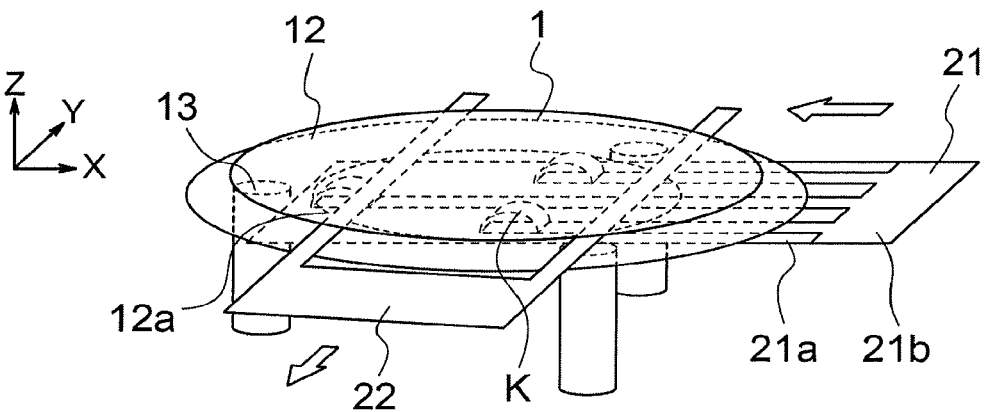

Next, the upper plate 21b slides relative to the lower plate 21a in the −X-direction, and thereby, the tips of the upper plate 21b are deformed (FIG. 7C). As a result, the tips of the upper plate 21b come into contact with the wafer 1 via the opening 12a of the boat 12 to elevate the wafer 1 (lift-up). Accordingly, the wafer 1 is brought into a state of being retained by the lifting arm 21 in place of the conveying arm 22.

Figure 8A:
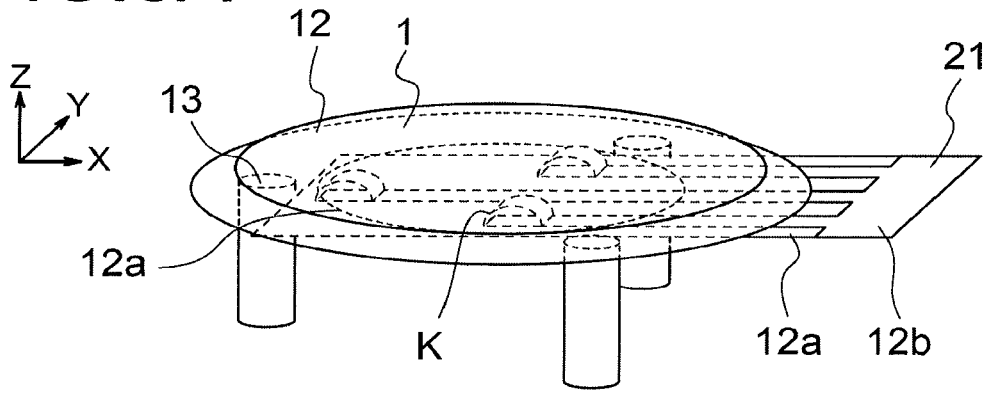

After completion of the lift-up of the wafer 1, the conveying arm 22 is retracted from the upper region of the boat 12 (FIG. 8A).

Figure 8B:
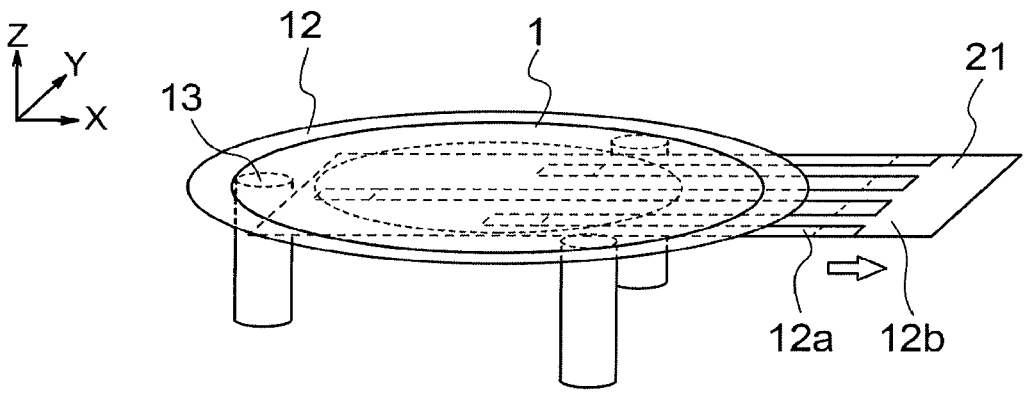

Next, the upper plate 21b slides relative to the lower plate 21a in the +X-direction, and thereby, the deformation of the tips of the upper plate 21b is relieved (FIG. 8B). As a result, the wafer 1 is lowered to be placed on the boat 12.

Figure 8C:
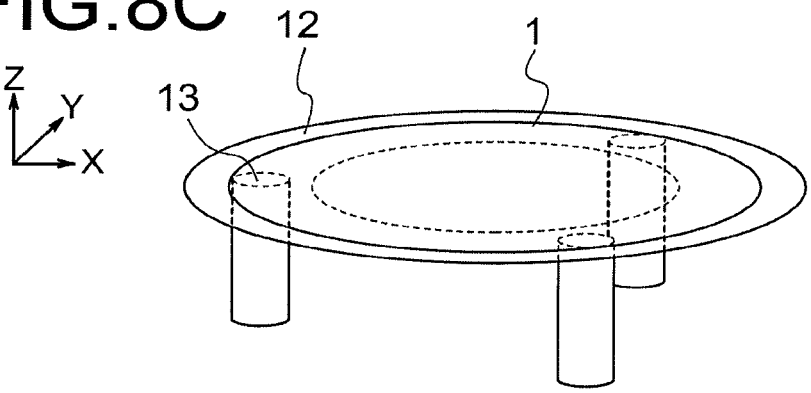

After completion of the placement of the wafer 1, the lifting arm 21 is retracted from below the boat 12 (FIG. 8C).

As above, the wafer conveying apparatus of the present embodiment places the wafer 1 on the boat 12 with the lifting arm 21 and the conveying arm 22. Thereby, the wafer 1 can be conveyed even when a space where the wafer conveying apparatus can move in the reactor 11 is small. In the semiconductor manufacturing apparatus of the present embodiment, the supporting columns 13 are positioned inside the outer circumferences E1 of the boats 12, which reduces the space where the wafer conveying apparatus can move. Therefore, this sort of wafer conveying apparatus is useful. According to the present embodiment, even in such a case, the wafer 1 can be appropriately conveyed.

In the present embodiment, the lifting arm 21 moves from a place in the +X-direction of the boat 12 to a place below the boat 12, and the conveying arm 22 moves from a place in the −Y-direction of the boat 12 to a place above the boat 12. Nevertheless, the lifting arm 21 and the conveying arm 22 may move from other places to the places below and above the boat 12, respectively. For example, when the lifting arm 21 moves from the place in the +X-direction of the boat 12 to the place below the boat 12, the conveying arm 22 may move from a place in the −X-direction of the boat 12 to the place above the boat 12.

Moreover, while the opening 12a of the present embodiment is circular, it may have another shape as long as the tips of the upper plate 21b can come into contact with the wafer 1 to elevate the wafer 1.

Moreover, the thickness of the lifting arm 21 may be arbitrarily set as long as the lifting arm 21 can be inserted between the boats 12 without the tips of the upper plate 21b deformed. Likewise, the thickness of the conveying arm 22 may be arbitrarily set as long as the conveying arm 22 can be inserted between the boats 12.

Furthermore, the wafer conveying apparatus of the present embodiment may include a single lifting arm 21 or may include a plurality of lifting arms 21. In the former case, the wafer conveying apparatus sequentially lifts up the plurality of wafers 1. In the latter case, the wafer conveying apparatus simultaneously lifts up a plurality of wafers 1. Likewise, the wafer conveying apparatus of the present embodiment may include a single conveying arm 22 or may include a plurality of conveying arms 22.

Figure 9:
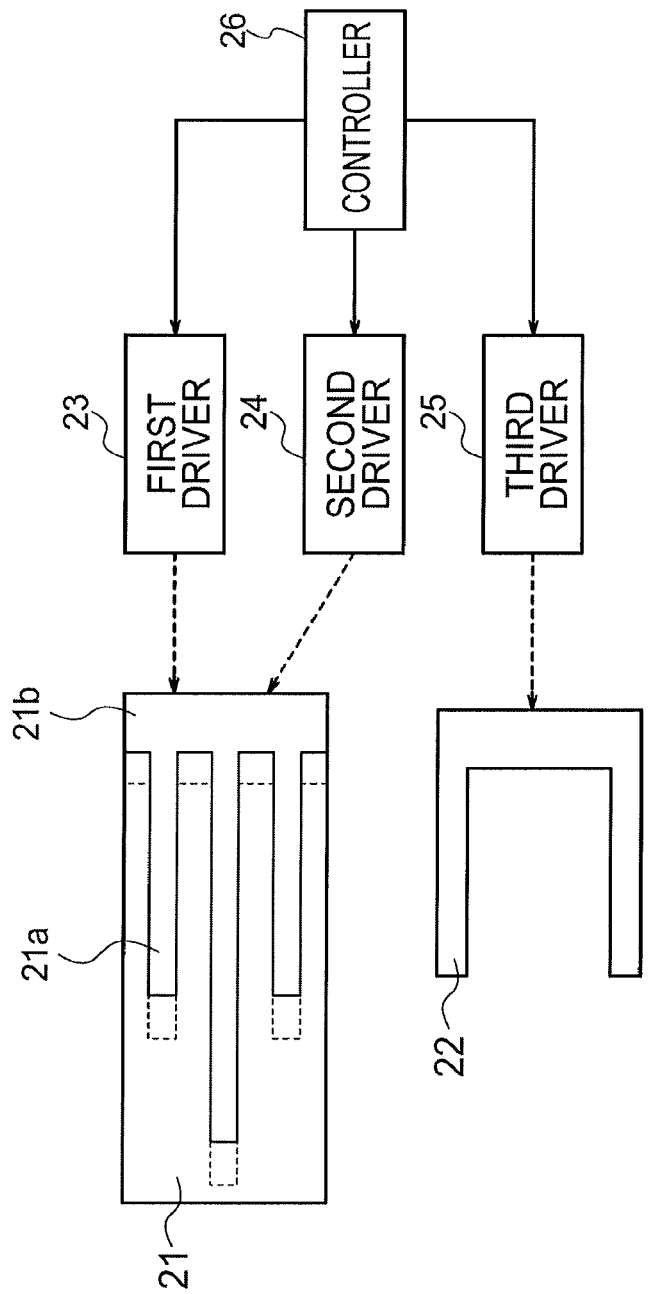
FIG. 9 is a schematic diagram showing a configuration of the wafer conveying apparatus of the first embodiment.

FIG. 9 is a schematic diagram showing a configuration of the wafer conveying apparatus of the first embodiment.

As shown in FIG. 9, the wafer conveying apparatus of the present embodiment includes the lifting arm 21, the conveying arm 22, a first driver 23, a second driver 24, a third driver 25 and a controller 26.

The first driver 23 is a mechanism that operates the lifting arm 21. For example, it moves the lifting arm 21 as in FIG. 7A, and retracts the lifting arm 21 as in FIG. 8C.

The second driver 24 is a mechanism that slides the upper plate 21b relative to the lower plate 21a. For example, it slides the upper plate 21b in the −X-direction as in FIG. 7C, and slides the upper plate 21b in the +X-direction as in FIG. 8B.

The third driver 25 is a mechanism that operates the conveying arm 22. For example, it moves the conveying arm 22 as in FIG. 7B, and retracts the conveying arm 22 as in FIG. 8A.

The first driver 23 is constituted, for example, of a motor and a mechanism that transmits power from the motor to the lifting arm 21. The same holds true for the second and third drivers 24 and 25. The first to third drivers 23 to 25 may be constituted of different motors or may be constituted of the same motors.

The controller 26 controls operation of the lifting arm 21 and the conveying arm 22 through control of the first to third drivers 23 to 25. The operation of the lifting arm 21 and the conveying arm 22 in FIGS. 7A to 8C is controlled by the controller 26. The controller 26 is an example of a processor, a controlling circuit, a computer or the like. The controller 26 may be the same as a controller that controls the whole semiconductor manufacturing apparatus or may be separate from the controller controlling the whole semiconductor manufacturing apparatus.

As above, the supporting columns 13 of the present embodiment are provided at positions where they are contained inside the outer circumferences E1 of the boats 12. Therefore, according to the present embodiment, the clearance W1 between the outer circumferences E1 of the boats 12 and the inner wall of the reactor 11 can be made short, which enables gas to be appropriately fed to the wafers 1.

Moreover, the wafer conveying apparatus of the present embodiment places the wafer 1 on the boat 12 with the lifting arm 21 and the conveying arm 22. Therefore, according to the present embodiment, the wafers 1 can be appropriately conveyed even when a structure in which the clearance W1 is short is employed.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a container configured to contain a plurality of wafers;
a plurality of supporting tables provided in the container so as to be stacked on one another, having annular shapes including outer circumferences and inner circumferences, and each including a supporting face that comes into contact with a wafer to support the wafer;
a plurality of supporting columns configured to join the supporting tables together and provided at positions where the supporting columns are contained inside the outer circumferences of the supporting tables;
a gas feeder configured to feed a gas to the wafers on the supporting tables; and
a gas discharger configured to discharge the gas fed to the wafers on the supporting tables,
wherein each of the supporting tables includes a first upper face as the supporting face, and a second upper face provided so as to surround the first upper face at a level higher than a level of the first upper face, and a distance between the outer circumferences of the supporting tables and an inner wall of the container is 10 mm or less,
wherein the supporting columns are configured to rotate around a rotational axis.

2. The apparatus of claim 1, wherein the supporting columns are provided at the positions where the supporting columns are contained between the outer circumferences and the inner circumferences of the supporting tables.

3. The apparatus of claim 1, wherein a diameter of the inner circumferences of the supporting tables is smaller than a diameter of the wafers.

4. The apparatus of claim 1, further comprising:
a first arm configured to move while retaining a first wafer in the container;
a second arm configured to elevate or lower the first wafer in the container; and
a controller configured to control the first and second arms,
wherein the controller controls the first and second arms such that:
the second arm moves to a lower region of a first supporting table,
the first arm retains the first wafer to move to an upper region of the first supporting table,
the second arm comes into contact with the first wafer via an opening provided in the first supporting table to elevate the first wafer,
the first arm is retracted from the upper region of the first supporting table after the first wafer is elevated, and
the second arm lowers the first wafer to place the first wafer on the first supporting table.

5. The apparatus of claim 4, wherein the second arm includes a first plate and a second plate configured to slide along a groove provided in the first plate, and elevates or lowers the first wafer through the slide of the second plate.

6. The apparatus of claim 5, wherein the second arm elevates the first wafer by deforming a portion of the second plate through the slide of the second plate, or elevates the first wafer by deforming a member positioned between the first plate and the second plate through the slide of the second plate.

7. The apparatus of claim 1, wherein the supporting tables are configured to rotate around the rotational axis with the supporting columns.

* * * * *